(12) United States Patent
Kawamura

(10) Patent No.: US 6,528,108 B1
(45) Date of Patent: Mar. 4, 2003

(54) METHOD AND APPARATUS FOR OBSERVING POROUS AMORPHOUS FILM, AND METHOD AND APPARATUS FOR FORMING THE SAME

(75) Inventor: Shigeru Kawamura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 27 days.

(21) Appl. No.: 09/668,855

(22) Filed: Sep. 25, 2000

(30) Foreign Application Priority Data

Sep. 27, 1999  (JP) .......................................... 11-272077

(51) Int. Cl.$^7$ .............................................. C23C 16/52
(52) U.S. Cl. .................. 427/8; 427/248.1; 427/255.12; 427/255.18; 438/14
(58) Field of Search .................... 427/8, 248.1, 255.12, 427/255.18; 438/14

(56) References Cited

U.S. PATENT DOCUMENTS 5,698,901 A    12/1997  Endo
5,900,290 A    5/1999   Yang et al.

FOREIGN PATENT DOCUMENTS

EP    0768388    4/1997

WO    99/19533    4/1999

OTHER PUBLICATIONS

Tsao et al., Mat. Res. Soc. Symp. Proc., vol. 53, (1986), pp. 199–204.*
Zhang et al., SPIE vol. 1758, Sol–Gel Optics II (1992), pp. 596–603.*
Gignac et al., Thin Solid Films, 261 (1995) pp. 59–63.*
John D. F. Ramsey, "Characterization of the Pore Structure of Membranes" Mrs Bulletin, Mar. 1999.

* cited by examiner

*Primary Examiner*—Timothy Meeks
(74) *Attorney, Agent, or Firm*—Crowell & Moring LLP

(57) ABSTRACT

A reactant gas is introduced into a process chamber under a temperature which is lower than reactive temperature of the reactant gas so that voids in a porous amorphous insulation film on a sample is filled with the introduced reactant gas. And chemical vapor deposition is carried out with heating the porous amorphous insulation film up to a temperature which is higher than the reactive temperature of the reactant gas to form a crystalline thin film on inner surfaces of the voids. Image data representing the porous amorphous insulation film in which the crystalline thin film is formed are generated with using a transmission electron microscope, and the porous amorphous insulation film is observed based on the image data to measure topographical characteristics of the porous amorphous insulation film such as void's size, porosity, etc.

11 Claims, 4 Drawing Sheets

METHOD AND APPARATUS FOR OBSERVING POROUS AMORPHOUS FILM, AND METHOD AND APPARATUS FOR FORMING THE SAME

BACKGROUND OF THE INVENTION

1. Field of the Invention

The present invention relates to a method and an apparatus for observing a porous amorphous film and a method and an apparatus for forming the porous amorphous film, more particularly to a method and an apparatus for observing shapes of voids in a porous amorphous film, and a method and an apparatus for forming the porous amorphous film.

2. Description of the Related Art

As semiconductor integrated circuits are getting smaller and faster, wiring capacitance has been a significant issue because it causes wiring delay. An insulation film having low dielectric constant has been focused on as an element which reduces wiring capacitance (parasitic capacity).

A porous insulation film is one of the low dielectric constant film. The porous insulation film has been formed by reducing crystal density of the film. In such the porous insulation film, porosity is inverse proportion to dielectric constant. For obtaining an insulation film having desired dielectric constant, the insulation film should have predetermined appropriate porosity. Measuring topographical characteristics of a porous insulation film such as void's diameter and porosity is a necessary factor for maintaining and managing the topographical characteristics.

Gas adsorption method (for example, using BET (Brunauer Emmet and Teller's) formula), observation by scanning electron microscope (SEM) or transmission electron microscope (TEM) are known methods for measuring the topographical characteristics of an porous material.

The gas adsorption technique approximates void's diameter, porosity, etc. The characteristics as above are calculated based on gas pressure when the gas is condensed in voids with using Kelvin's capillary tube condensation theorem. In this case, gas including molecules whose occupied cross sectional areas have been known is used.

The results obtained by the gas adsorption method, however, often have errors because the method assumes a cylinder model as the void.

In the observation by SEM, a porous material is scanned by a focused electron beam which is accelerated by voltage of, for example, 10–30 kv to detect secondary electrons emitted from the material's surface, and image data are prepared based on the detection. Void's diameter, porosity, etc. of the porous material are measured by observing the image data.

However, it is difficult to observe a void having a diameter of around 10 nm with using SEM, because SEM's maximum magnification is not so high in such range.

In the observation by TEM, an electron beam which is accelerated by an acceleration voltage of 100–300 kv is irradiated onto a sample which is a slice of porous material. Then, the electron beam transmitted through the sample is enlarged to prepare image data. Void's diameter, porosity, etc. of the porous material are measured by observing the image data.

Since maximum magnification of TEM is higher than that of SEM, the resultant image data of the TEM observation represents finer image which shows voids in detail. Therefore, more accurate measurement of topographical characteristics of the porous material such as void's diameter, porosity, etc. is available by the TEM observation.

In a case where a porous insulation film is made of an amorphous material such as a silicon oxide film, available image is unclear even if the TEM is used, because contrast between voids and insulator portions (silicon oxide crystal) in image is low. As a result, it is difficult to distinguish voids from other portions, and to observe shapes of voids in the porous insulation film.

SUMMARY OF THE INVENTION

The present invention has been made in consideration of the above, and it is an object of the present invention to provide a method and an apparatus for observing a porous amorphous film by which accurate observation of voids' shape in the porous amorphous film, and a method and apparatus for forming the porous amorphous film are available.

To achieve the above object, it is provided a method for observing a porous amorphous film comprising:

forming a crystalline thin film on inner surfaces of voids in a porous amorphous film; and generating image data representing the porous amorphous film having the crystalline thin film with using a transmission electron microscope.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

An embodiment of the present invention will now be described with reference to the accompanying drawings. In this embodiment, exemplified porous amorphous film is a porous amorphous insulation film.

Figure 1:
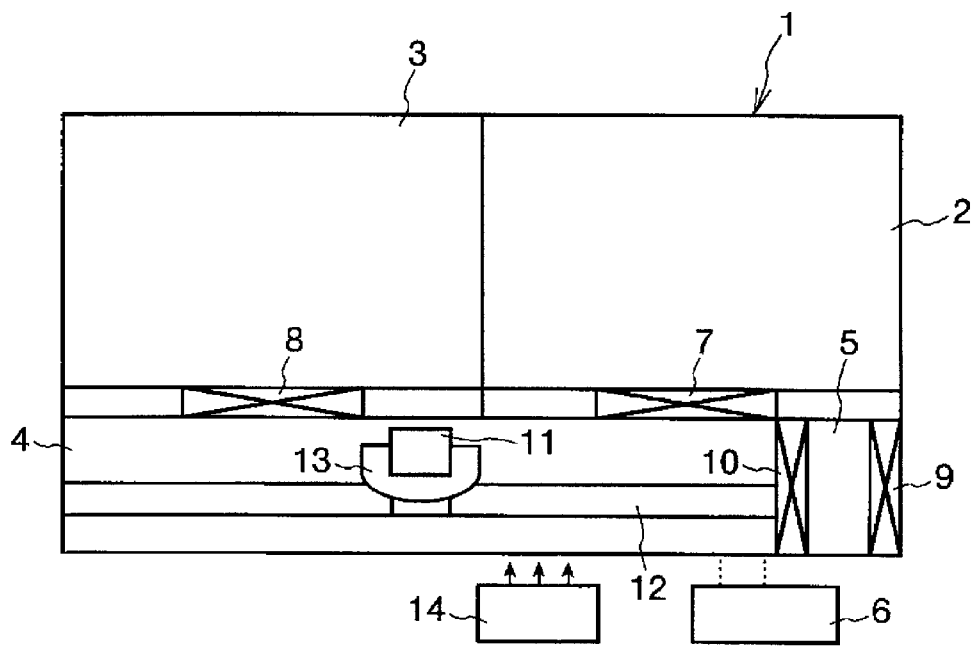
FIG. 1 is a diagram showing the structure of an apparatus for observing a porous amorphous insulation film according to an embodiment of the present invention.

FIG. 1 shows the structure of an observation apparatus 1 for observing the porous amorphous insulation film according to this embodiment. As shown in FIG. 1, the observation apparatus 1 comprises a process chamber 2, an observation chamber 3, a conveyer room 4, and a port section 5.

The process chamber 2 is a chamber to house a target porous amorphous insulation film to be observed and measured with predetermined process. More precisely, a thin film made of a crystalline material is formed on an inner surface of voids in the porous amorphous insulation film before observing a shape of the porous amorphous insulation film and measuring topographical characteristics.

The observation chamber 3 is equipped with a transmission electron microscope (TEM) for obtaining image data representing voids' shape in the porous amorphous insulation film. The TEM comprises an image processor (not shown). The image processor processes the image data representing the porous amorphous insulation film to calculate the topographical characteristics such as size of voids, porosity, etc. in the porous amorphous insulation film.

The conveyer room 4 connects the process chamber 2 and the observation chamber 3 for transferring a sample 11 from the process chamber 2 to the observation chamber 3. Insides of the process chamber 2, observation chamber 3, and conveyer room 4 are vacuumed by a pressure controller 6 including a vacuum pump, valves, etc.

The sample is loaded into/unloaded from the apparatus 1 through the port section 5. The port section 5 is a pressure controllable area under control of the pressure controller 6, thus, both vacuum state and normal pressure state are available in the port section 5.

The process chamber 2 and the conveyer room 4 are communicated with each other through a gate 7, and the observation chamber 3 and the conveyer room 4 are communicated with each other through a gate 8. The port section 5 is communicated with the outside through a gate 9. The conveyer room 4 and the port section 5 are communicated with each other through a gate 10. The sample 11 is loaded into the port section 5 through the gate 9. A movable arm 13 on a conveyer rail 12 in the conveyer room 4 fetches the target in the port section 5, thus the sample 11 is loaded into the conveyer room 4 through the gate 10. Then, the sample 11 is transferred to the process chamber 2 through the gate 7, and further transferred to the observation chamber 3 through the gate 8. A controller 14 comprising a microprocessor or the like controls open/shut operation of the gates 7, 8, 9 and 10, and movement of the movable arm 13.

Figure 2:
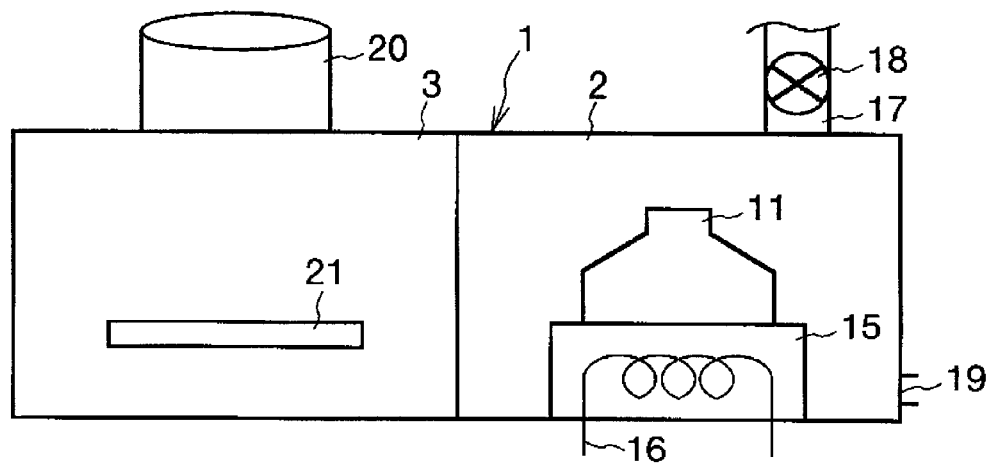
FIG. 2 is a diagram showing the structure of a process chamber and an observation chamber according to the embodiment of the present invention.

FIG. 2 shows the structure of the process chamber 2 and the observation chamber 3.

Figure 3:
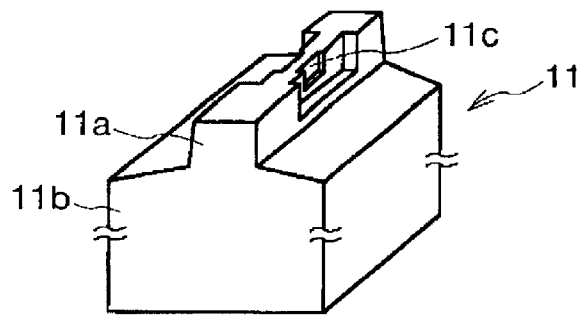
FIG. 3 is a diagram showing a sample for TEM observation according to the embodiment of the present invention.

As shown in FIG. 2, the process chamber 2 is an airtight chamber. The process chamber 2 is equipped with a stage 15 on which a sample 11 will be mounted. The sample 11 has an appropriate shape for measurement by TEM as shown in FIG. 3.

The stage 15 has a heater 16 therein for adjusting temperature of the sample 11 under control of the controller 14.

A gas introduction aperture 17 is formed at the chamber's ceiling for introducing gas which forms a crystalline thin film into the process chamber 2. The gas introduction aperture 17 is connected to a flow control valve 18. The controller 14 controls open/shut operation of the flow control valve 18 to adjust the gas flow rate of the gas being introduced into the process chamber 2.

The process chamber 2 has a vacuum aperture 19 at its lower end, which is connected to the pressure controller 6.

The controller 14 controls gas flow rate of introduced gas through the gas introduction aperture 17 and gas flow rate of vacuumed gas at the vacuum aperture 19 to maintain appropriate pressure in the process chamber 2.

The observation chamber 3 is an airtight chamber. The observation chamber 3 is equipped with a TEM (Transmission Electron Microscope) 20, and has a sample stay 21 inside. The sample stay 21 holds the sample 11, and the held sample 11 is observed by the TEM 20. The TEM 20 comprises an image processor (not shown) which comprises an image analyzer and the like.

Figure 4:
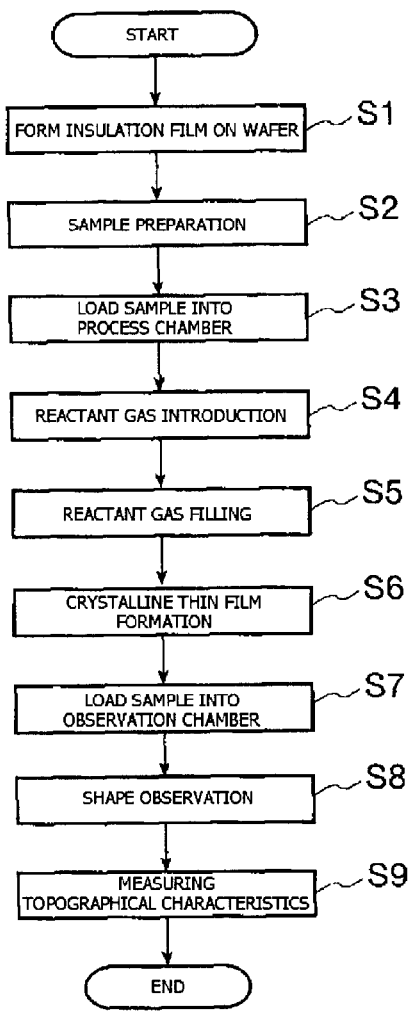
FIG. 4 is a flowchart for explaining observation steps according to the embodiment of the present invention.

Methods of observing shape of the porous amorphous insulation film and measuring topographical characteristics thereof by thus structured observation apparatus 1 will now be described with reference to FIG. 4 which is a flowchart for explaining steps of the observation and measurement.

First, an opened pore type porous amorphous insulation film is formed on a major surface of a semiconductor substrate made of silicon or the like (hereinafter, referred to as wafer) (step S1).

More precisely, liquid including silicon dioxide is applied onto a wafer by spin coat technique. Then, baking is carried out to remove volatile components, and curing is carried out to fix the film. Thus, a silicon oxide film having multiple minute voids whose inner diameter is around 1 to 50 nm is formed on the wafer. The multiple voids are communicated with each other. Some of them form openings at the surface of the silicon oxide film, that is, an opened pore type silicon oxide film is formed.

Then the wafer on which the porous silicon oxide film has been formed is shaped so as to be suitable for observation and measurement by the TEM 20. More precisely, the wafer on which the porous silicon oxide film is formed is diced by the dicing saw, and a focused ion beam is applied for fine processing to the dice to form the sample 11 having the shape shown in FIG. 3 (step S2).

In FIG. 3, a convexity 11a of the sample 11 is made of the porous silicon oxide film, and a base 11b of the sample 11 is made of a semiconductor layer. The convexity 11a has a measurement target portion 11c which is thinned so that an electron beam transmits there when measuring.

Thus shaped sample 11 is loaded into the port section 5 having the normal pressure. The controller 14 shuts the gate 9, and the pressure controller 6 vacuums the port section 5. Then, the controller 14 controls the arm 13 to fetch the sample 11 in the port section 5, and transfers it to the stage 15 in the process chamber 2 via the gate 10, the conveyer room 4, and the gate 7. After mounting the sample 11 on the stage 15, the controller 14 shuts the gate 7, thus, the process chamber 2 becomes an airtight room (step S3).

Figure 5:
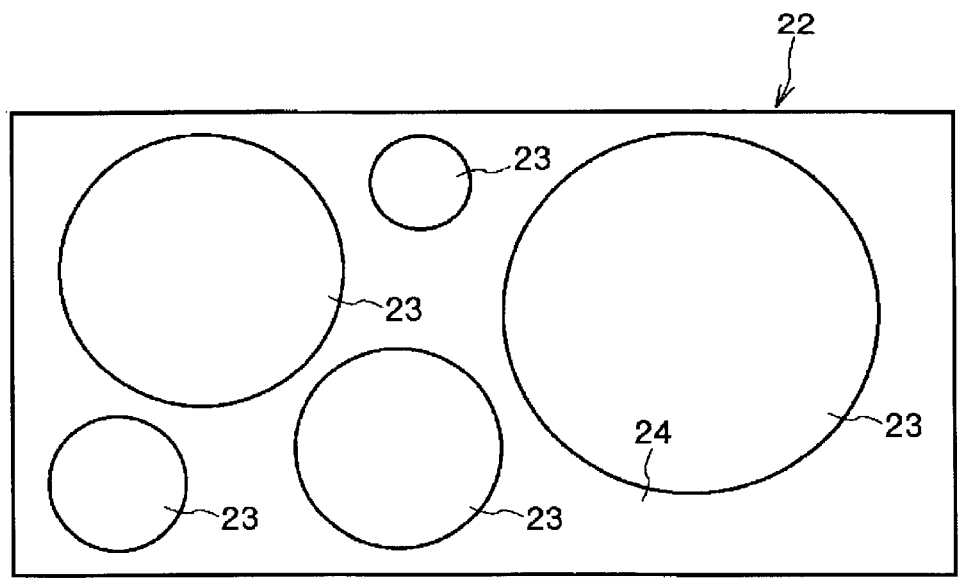
FIG. 5 is a diagram showing a porous silicon oxide film according to the embodiment of the present invention.
Figure 6:
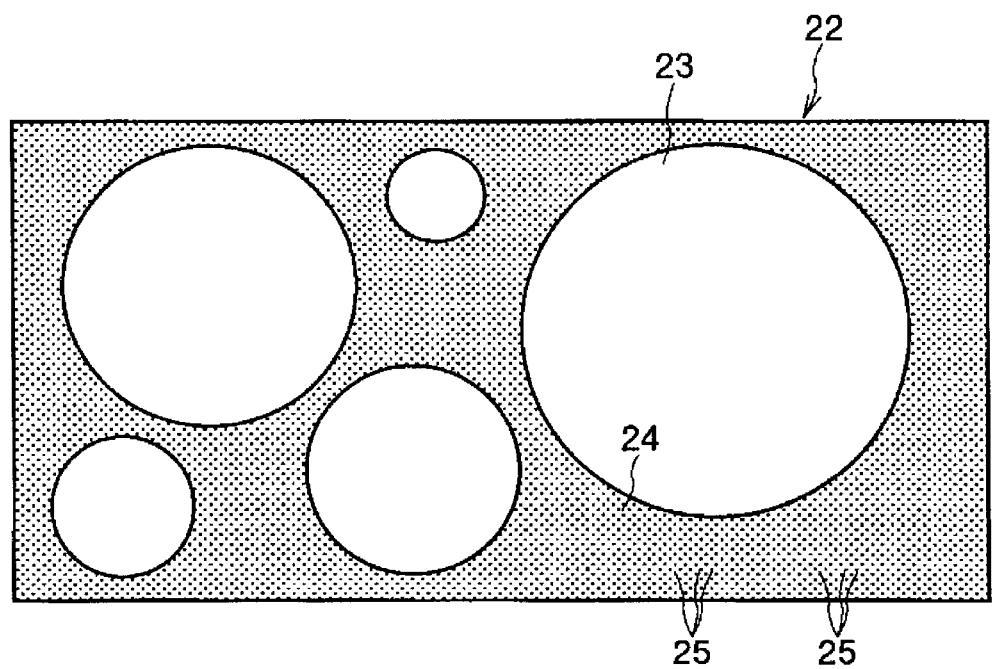
FIG. 6 is a diagram showing the state where reactant gas is filled in the porous silicon oxide film.
Figure 7:
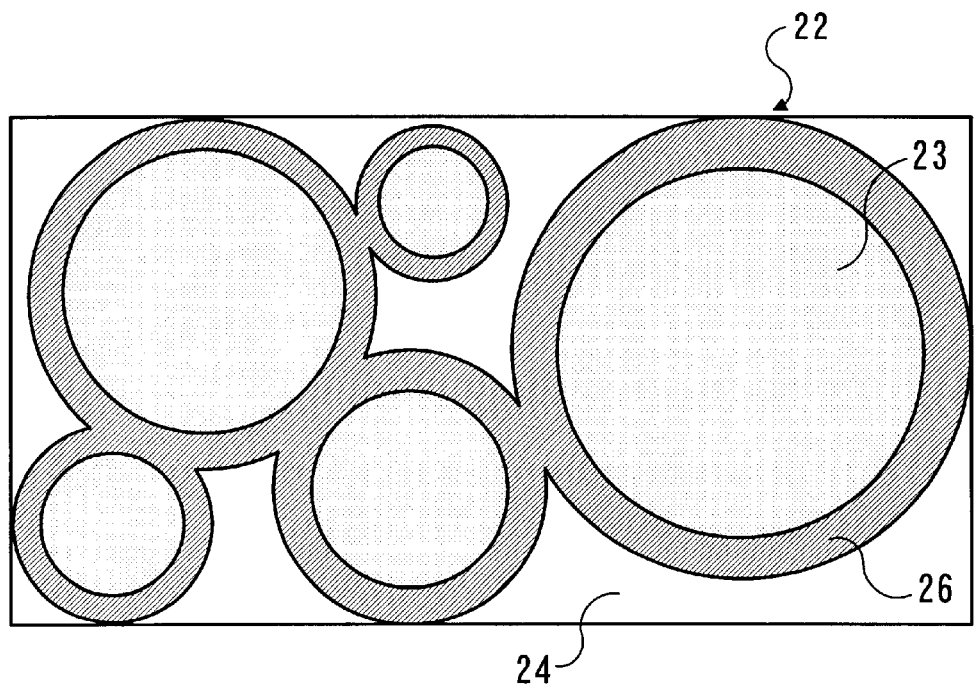
FIG. 7 is a diagram showing the state where a crystalline thin film is formed on the porous silicon oxide film according to the embodiment of the present invention.

Crystalline thin films will be formed on inner surfaces of voids in the porous silicon oxide film through the following steps. FIGS. 5 to 7 are schematic diagrams for explaining the crystalline thin film forming steps.

After the gate 7 is shut, the heater 16 is activated so that temperature of the sample 11 becomes predetermined temperature which is lower than decomposition temperature of a reactant gas for the crystalline thin film formation. In this embodiment, silane gas ($SiH_4$) whose decomposition temperature 400 degrees Celsius, is used as the reactant gas. The heater 16 controls the temperature of the sample 11 so as not to reach 400 degrees Celsius. FIG. 5 schematically shows the porous amorphous insulation film at this point. To be a comprehensive diagram, FIG. 5 simply shows insulator portions 23 which are silicon oxide particles and void 24 which represents a poriton other than the insulator sections 23.

The controller 14 opens the gas valve 18 to introduce the reactant gas for the crystalline thin film formation into the process chamber 2 through the gas introduction aperture 17, until the gas pressure reaches, for example, 27 Pa. Simultaneously, the controller 14 also controls the heater 16 to maintain the temperature of the sample 11 so as not to reach the decomposition temperature of silane gas: 400 degrees Celsius (step S4).

The introduced silane gas invades the porous silicon oxide film through the voids 24 which are communicated with each other. Thus, the silane gas is supplied to any areas except insulator portions 23 in the porous amorphous insulation film 22, as indicated by reference numerals 25.

Since the porous silicon oxide film used in this embodiment is opened pore type, silane gas easily invade the voids 24, therefore, the voids 24 is filled with silane gas 25 almost fully (step S5).

When the pressure in the process chamber 2 reaches 27 Pa, the controller 14 closes the flow control valve 18 so that no more silane gas is introduced into the process chamber 2, because the sample has been filled with enough silane gas 25 under the pressure of 27 Pa. Further, the controller 14 controls the heater 16 to heat the sample so that temperature exceeds crystallization temperature of the reactant gas (620 degrees Celsius or higher): for example, 650 degrees Celsius, and maintains that temperature during a predetermined time period. Under such the temperature, the silane gas 25 in the voids 24 is transformed into a polycrystalline film by decomposition reaction represented by chemical formula 1. Thus, a crystalline thin film 26 is formed as shown in FIG. 7 (step S6). In FIG. 7, the insulator portions 23 are hatched by dots, and the crystalline thin film 26 is hatched by lines to schematically represent the image obtained with using TEM of amorphous silicon oxide and polycrystalline silicon respectively.

$$SiH_4 \rightarrow Si+2H_2\uparrow \qquad \text{Chemical Formula 1}$$

After the crystalline thin film 26 is formed, the arm 13 brings the sample 11 to the observation chamber 3, and mounts it on the stay 21 via the gate 7, the conveyer room 4, and the gate 8 (step S7).

The TEM 20 irradiates an electron beam onto the target portion 11c of the sample 11, and obtains image data based on the electron beam transmitted through the target portion 11c. Shape of the amorphous silicon oxide film is observed with reference to the image data (step S8). More precisely, the TEM 20 irradiates electrons which are accelerated by voltage onto the target portion 11c of the sample 11, and generates an enlarged image data with using the electrons transmitted through the sample 11.

Finally, the image data processor of the TEM 20 processes the image data of the silicon oxide film to calculate (measure) topographical characteristics of the amorphous silicon oxide film, that is, voids' sizes, porosity, and the like (step S9).

In the silicon oxide film of the sample 11, the crystalline thin film 26 made of polycrystalline silicon is formed at marginal portions between amorphous silicon insulator particles 23 and the voids 24. Since the marginal crystalline thin film 26 is clearly contrasted from the insulator portions 23 and the voids 24 in the image data obtained by the TEM 20, it is easy to distinguish the voids 24 from the insulator portions 23. Such the well contrasted image is helpful to observe shapes of the voids 24 in the porous silicon oxide film 22. Further, the image data may be subjected to image data processing by, for example, an image analyzer, image analyzing software, or the like to measure size of each void 24 (including its diameter), porosity (cross section of voids/cross section of voids and insulator portions=number of pixels within the cross section of voids/number of pixels within the cross section of voids and the insulator portions).

Since the process chamber 2, observation chamber 3, and conveyer room 4 are almost vacuumed while the sample 11 is processed, the crystalline thin film does not contact atmosphere. Under this situation, the crystalline thin film does not transform into amorphous film. This characteristics is helpful to maintain excellent measurement accuracy.

The present invention is not limited to the above embodiment, but is applicable to various modifications. Another embodiment to which the present invention is applicable will now be described.

In the above embodiment, composition reaction of crystalline silicon using decomposition reaction of silane gas are utilized for forming the crystalline thin film on the inner surfaces of the void in the porous amorphous film. The present invention employs any process for forming the crystalline thin film.

For example, a crystalline thin film may be formed by reacting a plurality of gases instead of decomposition reaction of gas. In this case, tungsten hexafluoride ($WF_6$) and hydrogen are appropriate gases. Reaction of those gases are represented by chemical formula 2 below. Specifically, after introducing the gases into the chamber below the temperature of 200 degrees Celsius enough to fill voids in the porous amorphous film, the film is heated to 390 to 450 degrees Celsius to form a crystalline film of tungsten on the inner surfaces of the void in the film.

$$WF_6+3H_2 \rightarrow W+6HF\uparrow \qquad \text{Chemical Formula 2}$$

A combination of tungsten hexafluoride and silane is also appropriate one. Reaction of those gases are represented by chemical formula 3 below. Specifically, after introducing the gases into the chamber below the temperature of 100 degrees Celsius enough to fill voids in the porous amorphous film, the film is heated to 390 to 450 degrees Celsius to form a crystalline film of tungsten on the inner surfaces of the void in the film.

$$WF_6+SiH_4 \rightarrow W+SiF_6\uparrow+2H_2\uparrow \qquad \text{Chemical Formula 3}$$

The porous amorphous insulation film also employ any materials instead of the silicon oxide film, for example, a fluoride silicon oxide film, a silicon nitride film, etc. whatever it allows the crystalline thin film formation by filled reactant gas. The present invention is applicable to any porous amorphous film designed for various usage other than an insulation film.

In the above embodiment, silane gas was introduced into the voids 24 in the porous amorphous insulation film with pressure of 27 Pa, however, arbitrary pressure is applicable even if it is able to introduce the silane gas into the voids 24 to form a crystalline thin film. For efficient gas introduction, the pressure of the silane gas in the process chamber 2 may be, for example, modulated.

Material for forming the crystalline thin film is not limited to gaseous body, but may be liquid or colloidal body. For example, after filling the voids 24 of a porous amorphos insulation film 22 with a colloidal material, the porous amorphous insulation film 22 may be heated so as to remove (evaporate) solvent of the colloidal material to form a crystalline material on inner surfaces of the voids 24.

As the colloidal material, colloid suspension wherein inorganic pigment is dispersed in solvent (dispersant). In this case, the inorganic pigment may be, for example, cobalt pigment, iron pigment, chrome pigment, manganese pigment, etc. whose particle is several nm in size, and the solvent may be sodium naphthalenesulfonic acid formaline condensate, sodium methacresolsulfonic acid formaline condensate, etc. In this case, a sample is dipped into colloidal suspension which is heated around 120 to 130 degrees Celsius to disperse pigment molecules into voids. The sample is pulled up from the colloidal suspension, and the sample is heated up to around, for example, 300 degrees Celsius to remove solvent. Accordingly, required process temperature is lower than necessary temperature for forming a crystalline thin film by high temperature vapor reaction. Therefore, it is easy to carry out observation and measurement with using colloidal substance.

The structure of the observation apparatus 1 shown in FIGS. 1 and 2 is just exemplified, various structures are applicable to the observation apparatus. For example, arbitrary shapes and sizes may be applicable to the process chamber 2 and the observation chamber 3. Further, an arbitrary shaped carrier is applicable as means for transferring a sample between the process chamber 2 and the observation chamber 3, in stead of the movable arm 13.

Figure 8:
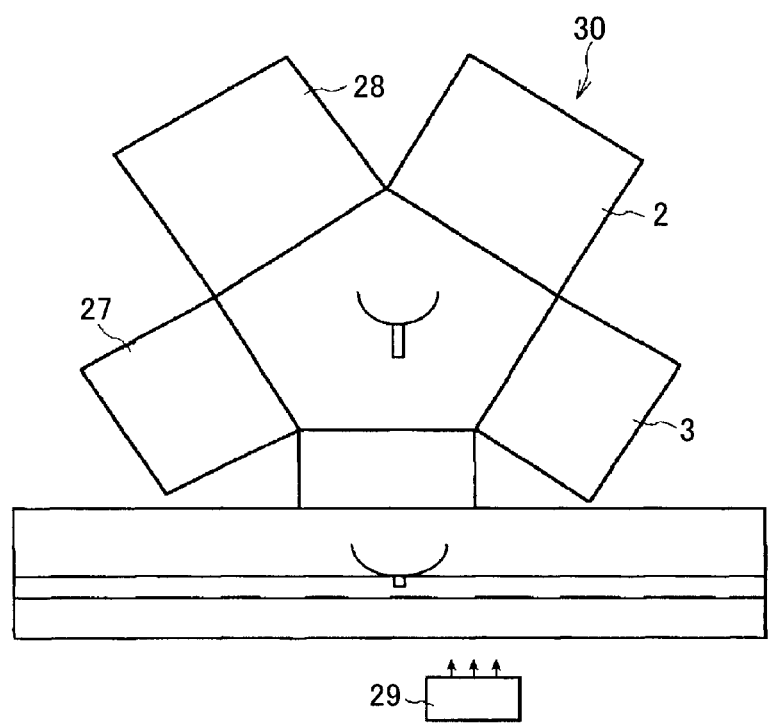
FIG. 8 is a schematic diagram showing an apparatus for observing a porous amorphous insulation film according to another embodiment of the present invention.

The observation apparatus described in the above embodiment was a single purpose apparatus for observing topographical characteristics such as porosity of a sample porous amorphous film. The present invention may be applicable to a multi-chamber deposition apparatus 30. FIG. 8 exemplifies the structure of the multi-chamber deposition apparatus 30. As shown in FIG. 8, the observation apparatus 1 for observing the porous amorphous insulation film is combined with a deposition chamber 27 and a sample preparation chamber 28. In such the multi-chamber deposition apparatus, a deposition controller 29 may control wafer deposition process in the following manner.

In the deposition process, a wafer is loaded into the deposition apparatus 30, and the wafer is transferred to the deposition chamber 27. After deposition of a porous amorphous film onto the wafer, the wafer will be unloaded.

Detailed steps during the deposition process are as follows. A test wafer is prepared constantly based on the number of processed wafers. A porous amorphous film is deposited on the test wafer in the above described manner. The test wafer on which the porous amorphous film is formed is transferred to the sample preparation chamber 27 to dice a sample which has appropriate shape for observation by TEM (see FIG. 3). The sample is transferred to the process chamber 2 to form a crystalline thin film on inner surfaces of voids in the sample porous amorphous film with using a predetermined reactant gas. Then, the sample is transferred to the observation chamber 3 to observe topographical characteristics such as porosity.

The deposition controller 29 stores topological characteristics data of the porous films obtained by the observations carried out in the observation chamber 3. The deposition controller 29 also controls baking temperature, baking time, etc. based on the stored data. Thus, the deposition controller 29 controls the deposition process so that resultant porous films constantly have predetermined topographical characteristics.

The multi-chamber deposition apparatus 30 may also have another deposition chamber for depositing a passivation film, etc. in addition to the observation apparatus according to the embodiments and the deposition chamber for depositing the porous amorphous insulation film. Further, it is obvious that a deposition apparatus of a porous amorphous film equipped with units for spin-coating, baking and curing can be arranged inline with the present observation apparatus to carry out similar deposition processes as of the above-described multi-chamber system.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-272077 filed on Sept. 27, 1999 and including specification, claims, drawings and summary. The disclosure of the above Japanese Patent Application is incorporated herein by reference in its entirety.

What is claimed is:

1. A method for observing a porous amorphous film comprising:

forming a crystalline thin film on inner surfaces of voids in a porous amorphous film; and generating image data representing said porous amorphous film having said crystalline thin film with a transmission electron microscope;

wherein said crystalline thin film is formed by chemical vapor deposition.

2. A method for observing a porous amorphous film comprising:

forming a crystalline thin film on inner surfaces of voids in a porous amorphous film; and generating image data representing said porous amorphous film having said crystalline thin film with a transmission electron microscope wherein said forming said crystalline thin film comprises:
      filling the voids in said porous amorphous film with a reactant gas for forming said crystalline thin film under a temperature which is lower than the decomposition temperature of the reactant gas; and
      carrying out chemical vapor deposition with heating said porous amorphous thin film up to a temperature which is higher than the crystallization temperature of the reactant gas to form said crystalline thin film on the inner surfaces of the voids.

3. A method for observing a porous amorphous film comprising:

forming a crystalline thin film on inner surfaces of voids in a porous amorphous film;

generating image data representing said porous amorphous film having said crystalline thin film with a transmission electron microscope; and calculating topographical characteristics of said porous amorphous film by processing the generated image data;

wherein said porous amorphous film is an insulation film, and said processing the image data measures porosity of said porous amorphous film.

4. The method according to claim 3, wherein said porous amorphous film is an opened pore type porous amorphous film.

5. A method for observing a porous amorphous film comprising:

forming a crystalline thin film on inner surfaces of voids in a porous amorphous film; and generating image data representing said porous amorphous film having said crystalline thin film with a transmission electron microscope wherein said forming said crystalline thin film comprises:

filling the voids in said porous amorphous film with a reactant gas for forming said crystalline thin film under a temperature which is lower than the decomposition temperature of the reactant gas; and carrying out chemical vapor deposition with heating said porous amorphous thin film up to a temperature which is higher than the crystallization temperature of the reactant gas to form said crystalline thin film on the inner surfaces of the voids;

wherein said filling the voids in said porous amorphous film with a reactant gas for forming said crystalline thin film under a temperature which is lower than the decomposition temperature of the reactant gas, and said chemical vapor deposition with heating said porous amorphous film up to a temperature which is higher than the crystallization temperature of the reactant gas are successively carried out under vacuum, to form said crystalline thin film on the inner surfaces of the voids.

6. A method of forming a porous amorphous film comprising:

forming a porous amorphous film on a substrate;

dicing a measurement sample having a predetermined shape from said substrate;

forming a crystalline thin film on inner surfaces of voids in said porous amorphous film on said sample;

generating image data representing said porous amorphous film, in which said crystalline thin film is formed, with a transmission electron microscope;

calculating topographical characteristics of said porous amorphous film by processing said image data; and forming said porous amorphous film based on said topographical characteristics.

7. The method according to claim 6, wherein said crystalline thin film is formed by chemical vapor deposition.

8. The method according to claim 6, wherein said forming said crystalline thin film comprises:

filling the voids in said porous amorphous film with a reactant gas for forming said crystalline thin film under a temperature which is lower than the decomposition temperature of the reactant gas;

carrying out chemical vapor deposition with heating said porous amorphous thin film up to a temperature which is higher than the crystallization temperature of the reactant gas to form said crystalline thin film on the inner surfaces of the voids.

9. The method according to claim 6, wherein said porous amorphous film is an insulation film, and said processing the image data measures at least any one of sizes of the voids in said porous amorphous film and porosity of said porous amorphous film.

10. The method according to claim 6, wherein said filling the voids in said porous amorphous film with a reactant gas for forming said crystalline thin film under a temperature which is lower than the decomposition temperature of the reactant gas, and said chemical vapor deposition with heating said porous amorphous film up to a temperature which is higher than the crystallization temperature of the reactant gas are successively carried out under vacuum, to form said crystalline thin film on the inner surfaces of the voids.

11. The method according to claim 6, wherein said porous amorphous film is an opened pore type porous amorphous film.

\* \* \* \* \*